United States Patent
Thangamani et al.

(10) Patent No.: US 12,053,954 B2
(45) Date of Patent: Aug. 6, 2024

(54) OPTIMISED DISPLAY SYSTEM FOR VEHICLE

(71) Applicants: SAINT-GOBAIN GLASS FRANCE, Courbevoie (FR); Arunvel Thangamani, Chennai (IN)

(72) Inventors: Arunvel Thangamani, Chennai (IN); Naveinah Chandrasekaran, Chennai (IN)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 0 days.

(21) Appl. No.: 17/912,354

(22) PCT Filed: Mar. 15, 2021

(86) PCT No.: PCT/IN2021/050264
§ 371 (c)(1),
(2) Date: Sep. 16, 2022

(87) PCT Pub. No.: WO2021/186470
PCT Pub. Date: Sep. 23, 2021

(65) Prior Publication Data
US 2023/0137674 A1    May 4, 2023

(30) Foreign Application Priority Data
Mar. 18, 2020   (IN) .............................. 202041011794

(51) Int. Cl.
*B32B 17/10*    (2006.01)
*B60R 1/00*    (2022.01)

(52) U.S. Cl.
CPC .. *B32B 17/10348* (2013.01); *B32B 17/10009* (2013.01); *B32B 17/10541* (2013.01); *B60R 1/00* (2013.01)

(58) Field of Classification Search
CPC ........ B32B 17/10348; B32B 17/10009; B32B 17/10541; B60R 1/00
(Continued)

(56) References Cited

U.S. PATENT DOCUMENTS

2016/0159282 A1    6/2016  Kurihara
2019/0385511 A1*  12/2019  T .......................... H05B 33/145

FOREIGN PATENT DOCUMENTS

EP    2 878 469 A1    6/2015
EP    3 593 197 A1    1/2020
(Continued)

OTHER PUBLICATIONS

International Search Report as issued in International Patent Application No. PCT/IN2021/050264, dated Jun. 17, 2021.

*Primary Examiner* — Tahseen Khan
(74) *Attorney, Agent, or Firm* — Pillsbury Winthrop Shaw Pittman LLP

(57) ABSTRACT

An optimized display system for a vehicle using a glass assembly. The system includes a power source coupled to the processing unit for providing an input DC voltage. The processing unit is coupled to the power source. The processing unit is configured to receive input. The processing unit generates a command signal to interactively control a display unit in response to at least one input. A convertor is coupled to the processing unit. The convertor is configured to generate at least one of an output AC voltage or output DC voltage based on the command signal. The display unit includes one or more illumination devices sandwiched in the glass assembly.

15 Claims, 5 Drawing Sheets

(58) Field of Classification Search
USPC .......................................................... 428/38
See application file for complete search history.

(56) References Cited

FOREIGN PATENT DOCUMENTS

| IN | 33/2018 | 8/2018 |
|----|---------|--------|
| WO | WO 2007/122426 A1 | 11/2007 |
| WO | WO 2018/078270 A1 | 5/2018 |
| WO | WO 2018/163208 A1 | 9/2018 |

\* cited by examiner

OPTIMISED DISPLAY SYSTEM FOR VEHICLE

CROSS-REFERENCE TO RELATED APPLICATIONS

This application is the U.S. National Stage of PCT/IN2021/050264, filed Mar. 15, 2021, which in turn claims priority to Indian patent application number 202041011794 filed Mar. 18, 2020. The content of these applications are incorporated herein by reference in their entireties.

TECHNICAL FIELD

The present disclosure relates generally to a display system in a glass assembly, it particularly relates to a glazing for a vehicle having the display system and more particularly, it relates to a display on the laminated glass of a vehicle.

BACKGROUND

Background description includes information that may be useful in understanding the present disclosure. It is not an admission that any of the information provided herein is prior art or relevant to the presently claimed invention, or that any publication specifically or implicitly referenced is prior art.

Automotive laminated glass comprising two sheets of rigid material such as glass sheet is already known. The glass sheets are connected together by a thermoplastic interlayer sheet usually comprising of polyvinyl butyral (PVB). Automotive laminated glass may be used in windscreens, rear windows, side windows, opening and non-opening roofs, rear-view mirrors or protective glass for headlamps.

Automotive glazing's are particularly designed to provide the driver a view of the forward region of the vehicle during driving and rearward region of the vehicle during reversing and other maneuvers. More recently, automobile laminated glass has shown a trend to incorporate functional elements such as light-emitting diode (LED) and electroluminescent (EL) into the laminated glass for lighting units, indicator lights etc. Typically, the insertion of light-emitting diodes (LEDs) into automotive laminated glass is limited to light indicators and internal lighting functionalities. In order to integrate additional functions such as alert messages, notification, displays, aesthetic lighting and ambient lighting into the automotive glazing, both LED and EL are integrated together onto the laminated glass.

A typical electroluminescent device comprises a luminescence layer that is interleaved between two conducting layers. However, using such normal electroluminescent device has one major safety related disadvantage. Whenever there is an external impact on the laminated glazing, which is integrated with an electroluminescent device the glazing can get damaged and can shatter into sharp pieces of fine glass and also might electrocute the driver and passengers, thereby increasing the possibility of injury caused to both the driver and passengers. Such external impact may happen due to foreign objects such as a small stone, a hailstones or a windborne debris.

Furthermore, when one or more illumination devices such as LED, EL and the like are integrated into the windshield, some illumination devices require a direct current i.e. DC based input, while some illumination devices alternating current, i.e. AC based input. Existing systems or laminated glass does not provide a solution for safely integrating one or more types of illumination devices within the glass. Further, existing systems do not address the safety concerns associated with an input voltage supplied to one or more connectors of the glazing.

There exists laminated glazing incorporating electroluminescent device used for diffusive lighting properties. WO2007122426 provides one example of such automobile glazing. It discloses a laminated glazing, in the form of a roof window comprising an electrical device in the form of an electroluminescent lamp integrated in the laminate construction. Further, US20160159282 provides a plurality of rectangular organic electroluminescent displays laminated in the laminated glass. However, the electroluminescent device integrated in the laminated glazing as mentioned in the above prior arts fail to disclose the power source and connector circuit coupled to the electroluminescent device. However, using such normal electroluminescent device does not provide features such as safety, electrical insulation and mechanical integrity in case of damages. Further, if the laminated glass breaks, it might also electrocute the driver and passengers due to the high voltage supplied to the illumination devices, thereby increasing the possibility of injury caused to both the driver and passengers.

Reference is made to Indian patent application 201741007887 disclosing a method of integration of electroluminescent layers within the interlayers of a laminated glazing by printing or depositing, thereby providing safety and electrical insulation. Here a voltage in the range of 50-100V is supplied directly through connectors, which can cause a short-circuit in case of breakage. Further, the existing prior arts do not mention a combination of one or more types of illumination devices such as EL, LED and the means to control power supply to the illumination devices. Moreover, the above mentioned prior art does not disclose a voltage reduction to the laminated glazing and means for reducing damages in case of breakage in case of the laminated glazing.

Hence, it would be desirable to provide a display unit within the laminated glazing that can power both AC and DC based illumination devices. Moreover, there exists need for a display unit within the laminated glazing that can control the power supplied to the display unit to ensure safety. Further, there is a need to provide a laminated glazing integrated with two or more illumination devices which is more safe for both the driver and the passenger in case of any cracking or chipping of the laminated glazing.

SUMMARY OF THE DISCLOSURE

An object of the present invention is to provide a display unit or display system within a glass assembly overcoming the drawbacks of the prior art.

Another object of the present invention is to provide a display unit within the laminated glazing that can power both AC and DC based illumination devices.

Yet another object of the present invention is to provide a display unit within a glass assembly that can control the power supplied to the display unit.

Still another object of the present invention is to provide a display unit within a glass assembly that can prevent causing injuries to a user in case of any cracking or chipping of the laminated glazing.

These and other objects of the invention are achieved by the following aspects of the invention. The following disclosure presents a simplified summary of the invention in order to provide a basic understanding of some aspects of the invention. This presents some concept of the invention in a simplified form to a more detailed description of the invention presented later. It is a comprehensive summary of the disclosure and it is not an extensive overview of the present invention. The intend of this summary is to provide a fundamental understanding of some of the aspects of the present invention.

The aforementioned objects and drawbacks mentioned in the background are overcome by an optimized system for display within the laminated glazing. The optimized system for display provides an electronic circuitry that power both AC based and DC based illumination devices. Further, the optimized system for display controls the power supplied to the display unit to ensure safety, by providing a voltage divider circuit. The optimized system also ensures voltage supply cut-off to the display unit in case of a breakage.

One aspect of the present disclosure is to provide an optimized display system for a vehicle using a glass assembly. The system comprises a power source coupled to the processing unit for providing an input DC voltage. The processing unit is coupled to the power source. The processing unit is configured to receive user input from an input device. The processing unit generates a command signal to interactively control a display unit in response to at least user input. The convertor is coupled to the processing unit. The convertor is configured to generate at least one of an output AC voltage or output DC voltage based on the command signal. The display unit is further coupled to the convertor. The display unit comprises one or more illumination devices sandwiched between a first substrate and a second substrate of the glass assembly. The illumination devices are fabricated with one or more connector channels where each are configured to receive a divided voltage. The one or more illumination devices receives one of an AC voltage input or a DC voltage input.

According to an embodiment herein, the processing unit is further coupled to one or more sensors for continuously monitoring the pressure on the glass assembly. The processing unit is further configured to monitor output from the sensor to determine breakage or stress on the display system. The processing unit is further configured to generate a predetermined cut-off voltage to the display system when a breakage or stress is determined. The sensor is a stress sensor and a vibration sensor.

According to an embodiment herein, the convertor comprises a step-down transformer for generating a second power voltage lower than the first power voltage based on the input power voltage. The convertor includes a switch circuit includes a plurality of switch transistors. The switch circuit is configured to convert the second power voltage to a third power voltage by turning on or off one or more of the switch transistors. The convertor comprises a relay driver that is used to generate a pre-determined voltage power required for powering the display unit.

Other features and aspects of this disclosure will be apparent from the following description and the accompanying drawings.

BRIEF DESCRIPTION OF THE DRAWINGS

The following briefly describes the accompanying drawings, illustrating the technical solution of the embodiments of the present invention or the prior art, for assisting the understanding of a person skilled in the art to comprehend the invention. It would be apparent that the accompanying drawings in the following description merely show some embodiments of the present invention, and persons skilled in the art can derive other drawings from the accompanying drawings without deviating from the scope of the disclosure.

Figure 1:
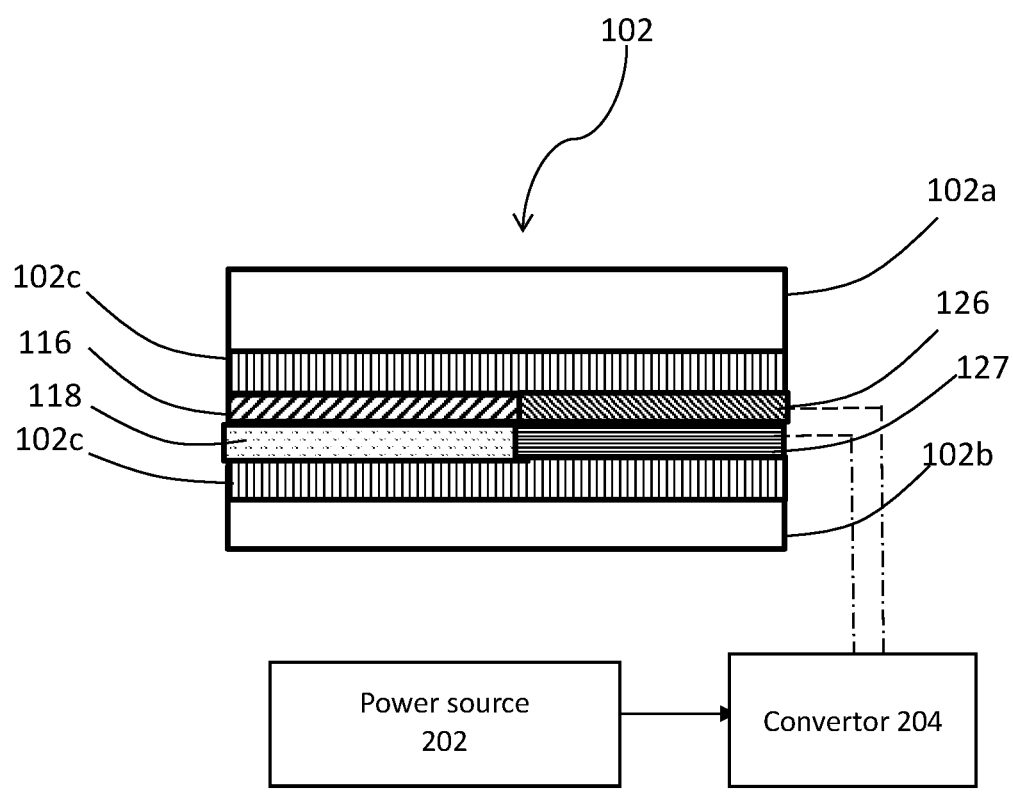
FIG. 1 illustrates a cross sectional view of a display unit in a glass assembly according to an embodiment of the present disclosure.

Persons skilled in the art will appreciate that elements in the figures are illustrated for simplicity and clarity and have not necessarily been drawn to scale. For example, the dimensions of some of the elements in the figures may be exaggerated relative to other elements to help to improve understanding of embodiments of the disclosure.

DETAILED DESCRIPTION

The present disclosure is now discussed in more detail referring to the drawings that accompany the present application. It would be appreciated by a skilled person that this description to assist the understanding of the invention but these are to be regarded as merely exemplary.

The terms and words used in the following description are not limited to the bibliographical meanings and the same are used to enable a clear and consistent understanding of the invention. Accordingly, the terms/phrases are to be read in the context of the disclosure and not in isolation. Additionally, descriptions of well-known functions and constructions are omitted for clarity and conciseness.

The present disclosure describes an optimized system for display in a glazing that provides a convertor in glazing that is capable of powering both AC based and DC based illumination devices. The one or more illumination devices which are part of the glass assembly are LED, electroluminescent displays, organic light emitting diodes (OLED). Further, the optimized system for display controls the power supplied to the display unit, by providing a voltage divider circuit, to ensure safety. The disclosed optimized system also provides sensor devices to determine breakage and ensure voltage supply cut-off to the display unit. This advantageously ensures safety of users while driving the vehicle.

FIG. 1 shows a cross-sectional view of a display unit (102) made using glass assembly according to an embodiment of the present invention. The display unit (102) includes a glazing. According to an implementation of the embodiment, the display unit is in a laminated glazing preferably a curved laminated glazing. The lamination comprises a first substrate (102a) having an outer face and a ceramic masked (104) inner face (not shown), one or more interlayers (102c) disposed on the inner face of the first substrate (102a), a second substrate (102b) disposed on the interlayer (102c) and one or more electroluminescent (EL) device (116) connected to connector element (126) and provided in the ceramic masked (104) inner face of the first substrate (102a). The EL device (116) is a powered by a AC input voltage. Further, an LED device (118) and connector element (127) is also disposed within the first substrate (102a) and the second substrate (102b). The LED device (118) is powered by an DC input voltage. The connectors (126 and 127) are further provided to a power source (202). The power source (202) is a DC input voltage. The power source (202) is further electrically coupled to a convertor (204) that converts DC voltage to AC. Further, the convertor (204) provides DC voltage through a divided voltage circuit. The convertor (204) also provides an AC voltage to one or more connector channels coupled to the one or more illumination devices (116, 118).

Further, the said smart controller may comprise input source. The converter further comprises at least a step down transformer, one or more switch transistors, and relay driver. To further understand the same, an example is considered. A person skilled in the art will appreciate that the example has been indicated as a means for enhancing the understanding of the skilled person and not by way of limitation.

If there is an input (say input A) that needs high bright light (like an alarm signal), it is preferred to have LED lighting panel for this as the brightness is usually very high for the same. Thus, input A requires a driving DC voltage of 5V with power 3.5 Watts. Again for another input (say input B) that needs visual animation pattern/mood lighting on glass, it is preferred to have more of soft lighting for this case and accordingly for the purpose, electroluminescent (EL) panel may be used. Thus, input B requires AC Voltage of 120V AC with Power 1 Watts. For the former case, i.e. for input A, when the respective signal A is triggered, the respective sensor signal is read by the processing unit. The processing unit is configured to determine whether the input is for LED or whether the input is for EL panel. The pre-processing signal is then directed to a relay module. The relay module is further configured to be equipped with input relay and at least 4 channel output relays. The input relay module may be a module of 12V, 5 Watts. In an exemplary implementation of the system, the relay module may take input power from a standalone power source or from the car battery and send output through channel 2. Further, in an implementation of the invention, for a frequency range 300-800 Hz (frequency range A) and 801-1000 Hz (frequency range B), the channel configurations may be detailed as:

Channel 1 configured as a channel for 12V DC, 4.1 Watt
Channel 2 configured as a channel for 5V DC, 3.5 Watt. This configuration may be achieved through step down transformer switch in the converter.
Channel 3 configured as channel for 120V AC, 1 Watt with frequency range A. This configuration may be achieved through DC AC rectifier in the converter.
Channel 4 configured as a channel for 120V AC, 1 Watt 800 Hz with frequency range B. This configuration is achieved through DC AC rectifier in the converter.
Channel 5 configured as a channel for 30 V AC, 1 Watt frequency range A. This configuration may be achieved through DC AC rectifier in the converter.

If input B is triggered, sensor signal is read by the processing unit configured to determine whether the input is for LED/EL and accordingly decides that if input is B, then EL is chosen. The processing signal then goes to the relay module. The relay module takes input power from the standalone power source/car battery and sends the output through channel 3.

The system comprises a display unit (102) present on the laminated glazing like the windshield of the vehicle. The display unit (102) comprises one or more illumination devices embedded between the first substrate and the second substrate of the laminated glazing. The display unit (102) is configured to display patterns, emoticons with varying intensity of illumination, frequency and colour. The display unit (102) may be transparent, opaque, semi-transparent and disposed on a visible region of the windshield or disposed behind a ceramic region of the windshield. Further, the display unit (102) is disposed on a visible region of the windshield including zone 'A', zone 'B' and zone 'C'. In another embodiment, the display unit is disposed behind a ceramic region (or the black ceramic region) of the windshield.

According to an embodiment, the first substrate (102a), the second substrate (102b) or both the first and the second substrate (102a, 102b) may be composed of glass or polymer. The polymer may be and not limited to polycarbonate (PC) or polypropylene (PP). Optionally, at least the first substrate (102a), the second substrate (102b) or both the first and the second substrate (102a, 102b) may be strengthened either chemically or thermally. The first substrate (102a), the second substrate (102b) or both the first and the second substrate (102a, 102b) may have a thickness of at least 0.5 mm.

According to an embodiment, one or more interlayer (102c) include a polymer. The interlayers (102c) comprises a polymer selected from the group consisting of poly vinyl butyral (PVB), polycarbonate, acoustic PVB, ethylene vinyl acetate (EVA), thermoplastic polyurethane (TPU), ionomer, a thermoplastic material, and combinations thereof. The interlayer may have a thickness of at least 0.38 mm. Optionally, the interlayers (102c) is modified to accommodate one or more illumination devices (116, 118). The interlayer (102c) is modified by either cutting, pressing, grinding, heating or combination thereof. The cutting of interlayer (102c) is done manually or automatically by means of cutting fixtures. The grinding of interlayer (102c) is done by means of abrasive wheel or pencil grinders which are electrically or pneumatically operated. Further, the interlayer (102c) can be modified by heating. In this, the electroluminescent device (116) is disposed on the interlayer (102c) by means of a hot stamping tool in which stamping is done by means of physical pressure and at a defined temperature. The led device (118) is integrated onto the interlayer by making a hole therein. In another instance, the led device (118) is integrated onto the laminated glass by encapsulation on the first substrate (102a) or the second substrate (102b). A skilled person will appreciate that the instances of incorporation of the illumination devices have been indicates by means of examples and not by way of limitations. Other suitable means of embedding the illumination device in the glazing is also possible without departing from the scope of the invention.

Figure 2:
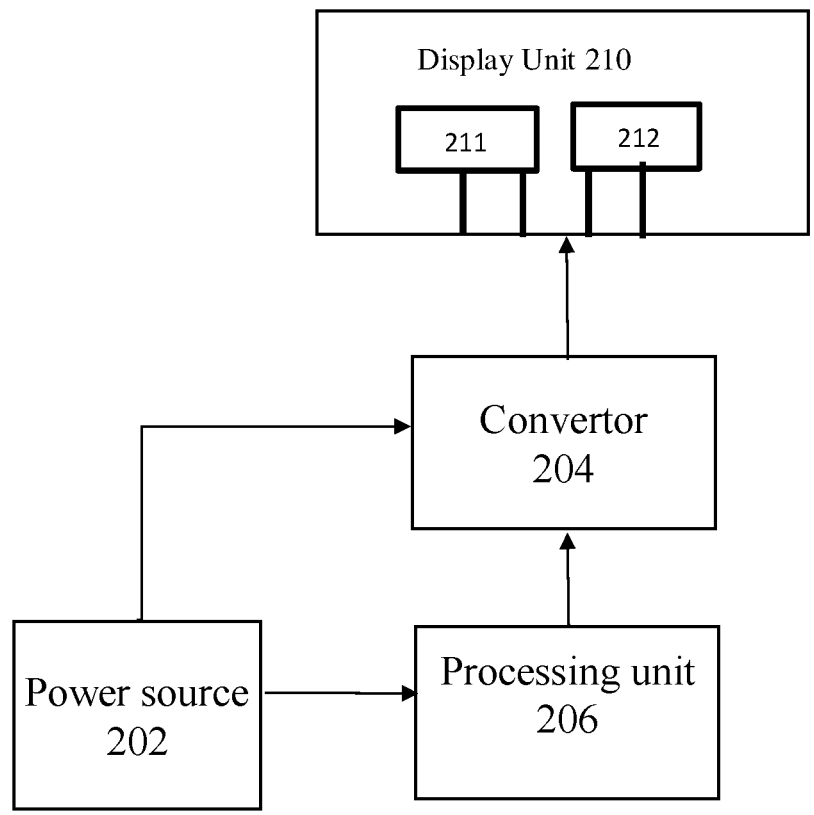
FIG. 2 illustrates a block diagram of the optimized display system according to an embodiment of the present disclosure.

FIG. 2 illustrates a block diagram of the optimized display system (200) according to an embodiment of the present invention. The optimized display system is to be used in an automotive glazing enabling uninterrupted power supply to the illumination devices. The optimized display system, hereafter referred to as system also provides power supply to the laminated glazing so that the voltage within the laminated glazing is maintained at predefined regulatory values.

The system comprises a display unit (210) adapted to be embedded within the laminated glazing. In an implementation of the invention, a windshield of a vehicle may include said laminated glazing. The display unit (210) is operably coupled to a convertor (204), that supplies one of AC input voltage or DC input voltage to the one or more illumination devices. The illumination devices (211, 212) are connected with one or more channels. Preferably, the illumination devices (211, 212) are fabricated with one or more connector channels where each of the channels are configured to receive a divided voltage. The one or more illumination devices (211, 212) receives one of an AC voltage input or a DC voltage input. The convertor (204) is configured to generate at least one of an output AC voltage or output DC voltage based on a command signal received from a processing unit (206). The processing unit (206) is configured to receive user input from an input device. The system further comprises a power source (206) coupled to the processing unit (206) for providing an input DC voltage. The processing unit (206) generates a command signal to interactively control the display unit (210) in response to at least one user input received through the input device.

In an implementation of the invention, the laminated glazing may include a controller unit preferably a smart controller unit comprising at least convertors and a processing unit. Smart controller is configured to be operational through one or more of the stress sensors. The stress sensors are preferably embedded within the glazing. On specific values of stress, the smart controller is configured to send signals such as command signals to the relay driver to pass in a cut-off voltage. The cut-off voltage is preferred to be pre-fed in the controller unit. The smart controller is not located in the glazing such as the glazing of a windshield but is located outside while the one or more of the stress sensors may be integrated in the glass.

The processing unit takes in the input from the one or more stress sensors and checks whether or not it is above a specific value or range of values, for the processing unit to take further actions. For instance, when the stress value is above 10 MPa, the processing unit is configured to communicate with the electronic control unit (ECU) or the telematics control unit (TCU) through a communication mode such as local interconnect network (LIN) bus or the controller area network (CAN) bus. The ECU or the TCU may be configured to be equipped with a communication means such as GSM or GPS to communicate with an emergency contact or an emergency center with a predefined message intimating the event and geolocation. In a preferred embodiment of the invention, the input power is always a DC Source of 12V DC and power up to 60 watts, such as the battery of the vehicle.

According to an embodiment herein, the processing unit (206) is further coupled to one or more sensors for continuously monitoring the pressure on the glass assembly. The processing unit (206) is further configured to monitor output from said sensor for measuring pressure to determine stress or the occurrence of breakage on the display system having the glazing. The processing unit (206) is further configured to generate a predetermined cut-off voltage to the display system when a breakage or stress is determined. The sensor for measuring pressure may be and not limited to a stress sensor and a vibration sensor. When the display system (102) is in a windshield, the processing unit (206) by determining breakage or damage probability prevents the occurrence of damages from breaking of the glazing.

According to an embodiment of the present invention, the convertor (204) provides one of AC voltage and/or DC voltage to the display unit (210). The convertor (204) provides AC and DC voltage to the connector channels of the display unit (210). In an embodiment of the invention, the convertor (204) is configured to supply the input voltage to the one or more illumination devices through multiple connector channels to arrive at an optimal voltage. This advantageously facilitates for the input voltage to be divided and be provided to the display unit (210), thereby maintaining the voltage safety regulations. Further, since the input voltage is provided through multiple connectors, the display unit (210) remains functional even in case of a damage to at least one of the illumination device.

Figure 3:
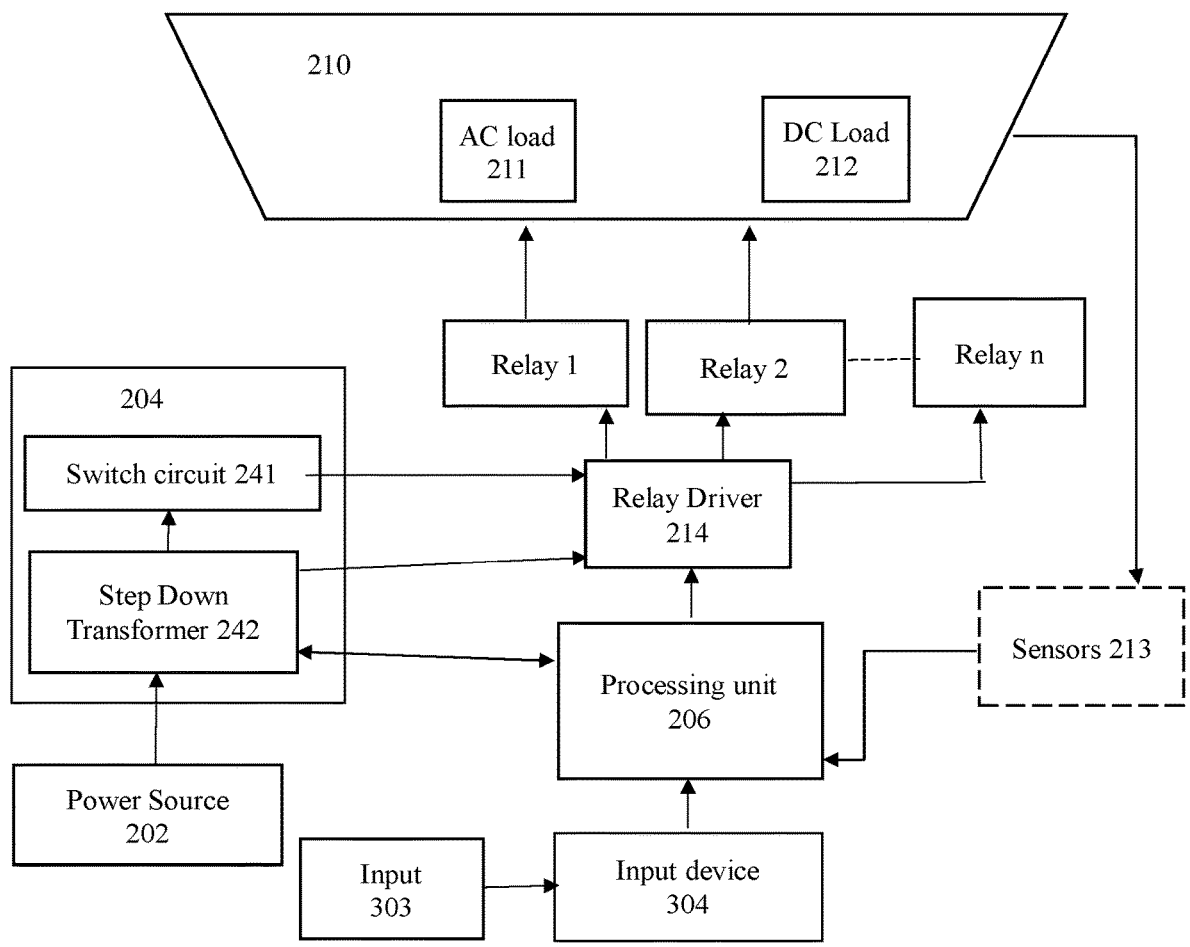
FIG. 3 illustrates an exemplary embodiment of the detailed block diagram of the optimized display system, according to an embodiment of the present disclosure.

FIG. 3 illustrates a detailed block diagram of the optimized display system. The system comprises a power source (202) coupled to the processing unit (206) for providing an input DC voltage. The convertor (204) is adapted to comprise a switch circuit (241), a step-down transformer (242) and/or inverter. The processing unit (206) is coupled to the power source through a step-down transformer. The step-down transformer (242) converts the high voltage (HV) and low current from the power source to the low voltage (LV) and high current value on a secondary side, which is further coupled to the relay driver (214).

The processing unit (206) is configured to receive user input from an input device (304). The processing unit (206) generates a command signal to interactively control a display unit (210) in response to at least one user input. Examples of the input device (304) includes a microphone, a touch screen, a bar code reader, and a gesture unit, selection keys and the like. In an example, when the input device is a microphone, a voice command is received in an analog form, which is further converted to a digital form. The voice command is transmitted to the processing unit (206). The processing unit maps the received voice command to a pre-defined emoticon or pattern and consecutively displays the mapped emoticon or pattern on the display unit. Other such instances of input may also be mapped as to a corresponding output. Thus, the display unit (210) is triggered by inputs from a user. Depending on the application for which the display unit is used, at least one of the illumination devices is selected and used for appropriate display. Based on the inputs received from the input device, the display can be shown in at least one of EL or LED device or a combination thereof.

The system comprises the convertor (204) that is coupled to the processing unit (206). The convertor (204) is configured to generate at least one of an output AC voltage or output DC voltage based on the command signal. The display unit (210) is operably coupled to the convertor. The display unit comprises one or more illumination devices (211, 212) sandwiched between a first substrate and a second substrate of the glazing or the glass assembly. The illumination devices (211, 212) are fabricated with one or more connector channels where each of the connector channels are configured to receive a divided voltage. The one or more illumination devices (211, 212) receives one of an AC voltage input or a DC voltage input. In figures that accompany the instant specification, AC and DC loads (211, 212) are the respective loads of the illumination device.

According to an embodiment of the present invention, the processing unit (206) is configured to generate command signals based on the signals received from the input device. The processing unit (206) transmits command signal to the display unit (210) to select one or more illumination devices and control lighting of the illumination devices. The display unit (210) is configured to display one or more patterns, emoticons, and modify illumination selectively in the one or more illumination devices. Further, the command signal is configured to selectively activate or de-activate the one or more illumination devices in the display unit (210). The processing unit (206) is also configured to regulate the power output to the display unit (210) and thereby it is capable of modifying the duration of illumination, frequency of illumination and luminosity of illumination.

According to an embodiment of the present invention, the power supply to the display unit (210) is managed by a step-down transformer (242) and the switch circuit (212). The step-down transformer (208) receives DC input from the power sources and generates a second power voltage lower than the input power voltage. In an implementation of the embodiment, the convertor may include a switch circuit (212) which is a bridge rectifier with a plurality of switch transistors. The switch circuit (212) is configured to convert the second power voltage to a third power voltage by turning on or off one or more of the switch transistors. The input power voltage is a DC based supply. The third power voltage is an AC voltage. The convertor (204) is further coupled to relay drivers like relay drivers 1, 2, . . . n that is used to generate a pre-determined voltage power required for powering the display unit. The second power voltage (DC based) and the third power voltage (AC based) are provided to multiple channels of the illumination devices through a relay driver (214).

Figure 4:
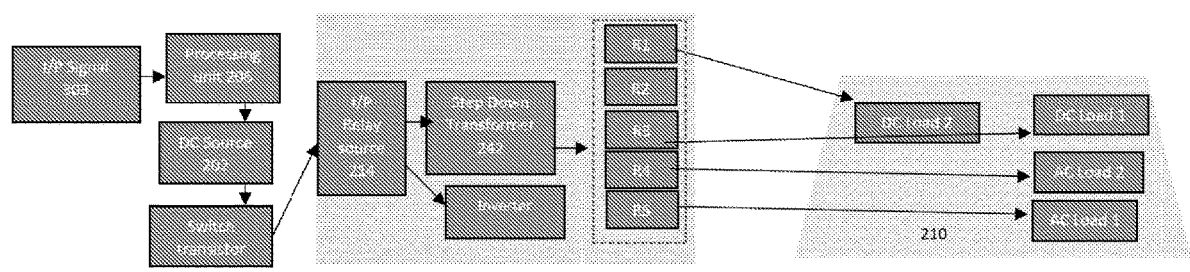
FIGS. 4 (a) and 4 (b) illustrates an exemplary embodiment of the arrangement of illumination devices in a voltage divider circuit according to an embodiment of the present disclosure.
Figure 4:
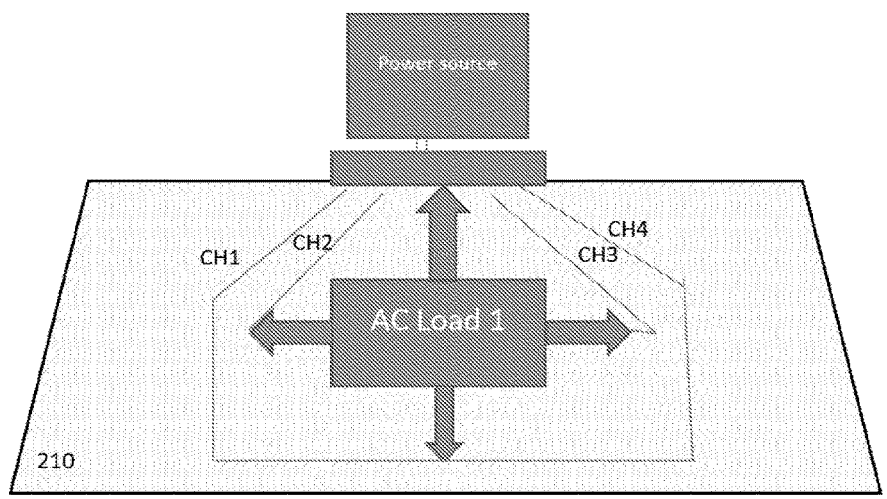

Reference is made to FIG. 4 (*a*) that illustrates an exemplary embodiment of the arrangement of illumination devices in a voltage divider circuit according to an embodiment of the present invention. The input signal (303) is sent to the processing unit (206). The processing unit (206) in turn is operably coupled with the DC source and the switch transistor. The input signal (303) via the relay source (214) is sent to the respective DC load (in the illumination device) and the respective AC load (also in the illumination device). The input signal in this embodiment may pass through the step down transformer 242 and inverter for converting a DC source to respective AC source for the AC load. Here, the step down transformer and the inverter are elements of the convertor. Reference is made to FIG. 4 (*b*) that illustrates the divided voltage being supplied to AC load via plurality of connector channels (CH1, CH2, CH3, CH4). Connector material of the connector channels may be and not limited to copper, silver or combination of the same with base material being PET, PEN, PI or FR4. which gives conductive characteristics for transferring power. Again, the connectors connecting the channels in the glass assembly and the display relay driver may be colour coded based on regulatory requirements or standards.

Figure 5:
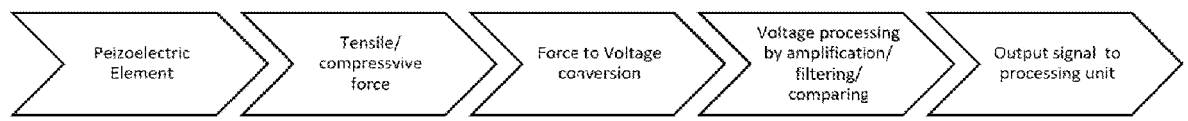
FIG. 5 illustrates a flow diagram for the operations of the smart controller according to an exemplary embodiment of the present disclosure.

Reference is made to FIG. 5 that depicts the flow diagram for the operations of the smart controller according to an exemplary embodiment of the present invention. The piezoelectric material (an example) of the stress sensor detects the presence of the stress by way of determining the value of the parameters associated with the stress. For instance, the stress may be measured by determining the tensile force or the compressive force. It may also be measured by way of other suitable parameters. The thus determined value of the trigger parameter (such as tensile or compressive force) is converted to voltage. Further, the voltage may be processed by amplification/filtering/comparing. The further processed voltage is sent as output signal to the processing unit. Smart controller is brought operational through the stress sensor in the glazing. In an implementation of the smart controller, on specific values of stress, it is configured to send signals (such as and not limited to command signals) to the relay driver to pass in a cut off voltage. The cur-off voltage is pre-determined in the processing unit. In a preferred embodiment of the invention, the said smart controller is not within the laminated glazing but it may be outside whereas the stress sensor may be integrated in the glass.

According to an exemplary embodiment of the present invention, the illumination devices include at least one of EL and LED. An instance of an application is, in car displays are to be provided without distracting the driver EL is used. The display unit in this case, for example, would be used for alerts and notifications about vehicle conditions and dashboard data. Again, in another instance, where display is required outside the car for passengers and other drivers, LED may be used. For example, alerts and warning messages to other vehicles and passengers can be displayed through LED visible from outside. In another example, both EL and LED can be used for display for both in-car display and external display simultaneously. In a scenario, where a passenger attempts to open a vehicle door, the driver of the vehicle may have a display using EL, and the pedestrians or passers may view an indicator using LED to indicate opening of the door. It would be appreciated by one skilled in the art that the various examples indicated herein are provided for enhancing the understanding of the skilled person and are not provided by way of limitation.

According to an embodiment of the present invention, the processing unit (206) is further coupled to one or more sensors (213) for continuously monitoring the pressure on the glazing or the glass assembly. The processing unit (206) is further configured to monitor output from the sensor to determine breakage or stress on the display system. The sensor (213) as shown in FIG. 3 may be embedded as part of the laminated glazing or may be operably connected to the glazing. The processing unit (206) is further configured to generate a predetermined cut-off voltage to the display system when a breakage or stress is determined. Examples of sensor (213) include a stress sensor and a vibration sensor. Other sensors for serving the function may also be used.

According to an embodiment of the present invention, the optimized display described herein may be utilized in vehicles such as automobiles for glazing such as windshields, windows or sidelight's, mirrors. The illumination devices are either optically transparent, opaque or translucent. The electroluminescent device comprises a material selected from the group consisting of organic or inorganic material. The electroluminescent devices have the luminescence value of at least 1 Cd/m$^2$. It would be appreciated by the skilled person that this is included by way of example to enhance the understanding of the skilled person and not by way of limitation.

In an embodiment, the power source is switched ON/OFF by the vehicle ignition switch. The sensor along with the power source may be individually switched ON/OFF by an additional switch placed within the vehicle to reduce the power consumption and based on requirement for real time monitoring. The power source is located in any suitable part or mechanism of the vehicle and not limited to the dash board of the vehicle.

The following table 1 illustrates the voltage supplied by the optimization circuit.

| Input power | Convertor output | Input to Illumination device |
|---|---|---|
| 12-48 V | 3.3-5 V DC | LED- 3.3-5 V<br>EL- 30-300 V AC divided<br>through 2 or more channels |

The power supplied by the power source or battery of the vehicle is in the range of 12 to 48V. However, the input power supplied to the illumination device is in the range of 3 to 5V. Thus, the voltage is regulated on the laminated glazing to ensure safety.

According to an embodiment of the present disclosure, the optimized display system is implemented in a windshield of a vehicle. The windshield includes a display unit with one or more illumination devices. Further, the windshield includes connector channels with wirings. The windshield is also provided with a smart controller unit including convertors and processing unit. The smart controller unit includes an input/output interfaces to the connector channels and Engine Control unit of the vehicle. However, the display system disclosed herein may also be included in another glass assembly as well such as tempered glass.

INDUSTRIAL APPLICABILITY

In an embodiment, an optimized display system for a vehicle is disclosed. The optimized display system controls the display unit in a vehicle windshield to provide real time notification and alerts and indication to the driver and outside passengers. The optimized system for display provides an electronic circuitry that power both AC based and DC based illumination devices. Further, the optimized system for display controls the power supplied to the display unit to ensure safety, by providing a voltage divider circuit. The optimized system also ensures voltage supply cut-off to the display unit in case of a breakage.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Certain features, that are for clarity, described herein in the context of separate embodiments, may also be provided in combination in a single embodiment. Conversely, various features that are, for brevity, described in the context of a single embodiment, may also be provided separately or in a sub combination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

The description in combination with the figures is provided to assist in understanding the teachings disclosed herein, is provided to assist in describing the teachings, and should not be interpreted as a limitation on the scope or applicability of the teachings. However, other teachings can certainly be used in this application.

As used herein, the terms "comprises", "comprising", "includes", "including", "has", "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one or at least one and the singular also includes the plural, or vice versa, unless it is clear that it is meant otherwise. For example, when a single item is described herein, more than one item may be used in place of a single item. Similarly, where more than one item is described herein, a single item may be substituted for that more than one item.

Unless otherwise defined, all technical and scientific terms used herein have the same meaning as commonly understood by one of ordinary skill in the art to which this invention belongs. The materials, methods, and examples are illustrative only and not intended to be limiting. To the extent that certain details regarding specific materials and processing acts are not described, such details may include conventional approaches, which may be found in reference books and other sources within the manufacturing arts.

While aspects of the present disclosure have been particularly shown and described with reference to the embodiments above, it will be understood by those skilled in the art that various additional embodiments may be contemplated by the modification of the disclosed machines, systems and methods without departing from the spirit and scope of what is disclosed. Such embodiments should be understood to fall within the scope of the present disclosure as determined based upon the claims and any equivalents thereof.

List of reference numerals used and the corresponding features:
- 102: laminated glass display unit
- 102a: first substrate
- 102b: second substrate
- 102c: interlayer
- 202: power source
- 204: convertor
- 206: processing unit
- 116: illumination device (electroluminescent device)
- 118: illumination devices (LED device)
- 126, 127: connector channels
- 211: AC load of the illumination device
- 212: DC load of the illumination device
- 210: display unit on the glass assembly
- 241: switch circuit
- 242: step down transformer
- 303: input
- 304: input device
- 214: relay driver
- 213: sensors

The invention claimed is:
1. An optimized display system using a laminated glazing in a vehicle, wherein the system comprises:
a processing unit configured to receive at least one input from an input device, wherein the processing unit is further configured to generate a command signal to interactively control a display unit in response to the at least one input;

a convertor coupled to the processing unit, wherein the convertor is configured to generate at least one of an output AC voltage or output DC voltage based on the command signal;

a power source coupled to the processing unit for providing an input DC voltage;

a display unit coupled to the convertor, wherein the display unit comprises one or more illumination devices embedded between a first substrate and a second substrate of the glazing, and wherein the one or more illumination devices are operably connected with one or more connector channels;

wherein each of the one or more connectors channels are configured to receive a divided voltage, and the one or more illumination devices are configured to receive one of an AC voltage input or a DC voltage input, and wherein the one or more illumination devices are chosen from a light emitting diode (LED), an electroluminescent (EL) display, and an organic light emitting diode (OLED).

2. The system as claimed in claim 1, wherein the processing unit is further coupled to one or more sensors for continuously monitoring the stress on the glazing.

3. The system as claimed in claim 1, wherein the processing unit is further configured to monitor output from the sensor to determine breakage or stress on the display system.

4. The system as claimed in claim 2, wherein the processing unit is further configured to generate a predetermined cut-off voltage to the display system when a breakage or stress is determined.

5. The system as claimed in claim 1, wherein the one or more sensors include a stress sensor and/or a vibration sensor.

6. An optimized display system using a laminated glazing in a vehicle, wherein the system comprises:

a processing unit configured to receive at least one input from an input device, wherein the processing unit is further configured to generate a command signal to interactively control a display unit in response to the at least one input;

a convertor coupled to the processing unit, wherein the convertor is configured to generate at least one of an output AC voltage or output DC voltage based on the command signal;

a power source coupled to the processing unit for providing an input DC voltage;

a display unit coupled to the convertor, wherein the display unit comprises one or more illumination devices embedded between a first substrate and a second substrate of the glazing, wherein the one or more illumination devices are operably connected with one or more connector channels, wherein each of the one or more connectors channels are configured to receive a divided voltage, and the one or more illumination devices are configured to receive one of an AC voltage input or a DC voltage input, and wherein the convertor comprises:

a step-down transformer configured to generate a second power voltage lower than a first power voltage based on the input power voltage;

a switch circuit including a plurality of switch transistors, the switch circuit configured to convert the second power voltage to a third power voltage by turning on or off one or more of the switch transistors; and a relay driver configured to generate a pre-determined voltage power required for powering the display unit.

7. The system as claimed in claim 6, wherein the third power voltage is an AC voltage.

8. The system as claimed in claim 1, wherein the input comprises selection of at least one illumination device from a plurality of illumination devices.

9. The system as claimed in claim 1, wherein the processing unit is configured to select at least one of the connector channels coupled to the illumination device.

10. The system as claimed in claim 1, wherein the processing unit is further configured to transmit command signals to operate at least one of a DC powered illumination device or an AC powered illumination device.

11. The system as claimed in claim 1, wherein the one or more illumination devices of the display unit are arranged in a voltage divider circuit through the connector channels.

12. The system as claimed in claim 11, wherein the voltage divider circuit is configured to operate in an input voltage range of around 30V to 300V.

13. The system as claimed in claim 1, wherein the display unit is configured to operate in an input voltage lower than the input voltage received from the power source.

14. The system as claimed in claim 1, wherein the one or more illumination devices are transparent or non-transparent and disposed on a visible region of the laminated glazing or disposed behind a ceramic region of the laminated glazing wherein said laminated glazing is in a windshield of the vehicle.

15. The system as claimed in claim 1, wherein the one or more illumination devices include a first illumination device that is configured to receive the AC voltage input and a second illumination device that is configured to receive the DC voltage input.

* * * * *